United States Patent [19]

Henderson, Sr. et al.

[11] 4,244,752

[45] Jan. 13, 1981

[54] SINGLE MASK METHOD OF FABRICATING COMPLEMENTARY INTEGRATED CIRCUITS

[75] Inventors: Donald L. Henderson, Sr., Encinitas; Steven M. Baldwin; Raymond Pong, both of Escondido, all of Calif.

[73] Assignee: Burroughs Corporation, Detroit, Mich.

[21] Appl. No.: 17,842

[22] Filed: Mar. 6, 1979

[51] Int. Cl.³ .................. H01L 21/263; B01J 17/00
[52] U.S. Cl. .................................. 148/1.5; 148/187; 357/34; 357/43; 357/91
[58] Field of Search .................. 148/1.5, 187; 357/23, 357/91, 34, 43; 29/571

[56] References Cited

U.S. PATENT DOCUMENTS

| | | | |
|---|---|---|---|
| 3,853,633 | 12/1974 | Armstrong | 148/1.5 |
| 3,868,274 | 2/1975 | Hubar et al. | 148/1.5 |
| 3,928,081 | 12/1975 | Marley, Jr. et al. | 148/1.5 |
| 3,983,620 | 10/1976 | Spadea | 29/571 |
| 4,001,048 | 1/1977 | Meiling et al. | 148/1.5 |
| 4,005,450 | 1/1977 | Yoshida et al. | 357/23 |
| 4,009,057 | 2/1977 | De Brebisson et al. | 148/1.5 |
| 4,045,250 | 8/1977 | Dingwall | 148/1.5 |
| 4,046,606 | 9/1977 | Lambert | 148/187 |
| 4,052,229 | 10/1977 | Pashley | 148/1.5 |
| 4,101,344 | 7/1978 | Kooi et al. | 148/1.5 |
| 4,104,784 | 8/1978 | Klein | 29/571 |

OTHER PUBLICATIONS

Enomoto et al., ". . . Oxidation . . . Si₃N₄ Film . . . "Jap. Journ. Appl. Phys. 17 (1978) 1049.

Primary Examiner—L. Dewayne Rutledge
Assistant Examiner—Upendra Roy
Attorney, Agent, or Firm—Mervyn L. Young; Charles J. Fassbender; Kevin R. Peterson

[57] ABSTRACT

A method of fabricating an integrated circuit having a plurality of different devices, which method employs a single mask to define the active areas of all such devices. A silicon oxide-silicon nitride layer is formed on the surface of a silicon wafer so as to define the location of subsequent oxide insulating layers which in turn actually define all the active areas of the circuit. Respective active areas for the different devices can then be formed by selective ion implantation.

9 Claims, 14 Drawing Figures 4,244,752

SINGLE MASK METHOD OF FABRICATING COMPLEMENTARY INTEGRATED CIRCUITS

RELATED U.S. PATENT APPLICATION

U.S. patent application directly or indirectly related to the subject application is as follows:

Ser. No. 017,841, filed Mar. 6, 1979 by Donald L. Henderson, Sr., and entitled "Polysilicon Interconnect Structure for Complementary MOS Devices."

BACKGROUND OF THE INVENTION

1. Field of Invention

This invention relates to a method of fabricating high density integrated circuits which method employs a single mask to define all devices in the circuit. More particularly, this invention relates to a method of fabricating complementary MOS integrated circuits.

2. Description of Prior Art

As the packing density of integrated circuits is improved, greater alignment accuracy is required for the devices in the circuit to prevent shorting out between such devices. This in turn requires smaller tolerances in the masks employed in the various steps in the fabricating of such devices as well as in the alignment of such masks. This is particularly true when the circuits being fabricated include complementary MOS circuits.

Complementary MOS circuits are normally circuits which employ both N channel devices and P channel devices in the same integrated circuit chip. N channel devices provide faster switching time but have higher power dissipation than P channel devices. However, these devices switch to the on condition for different polarities of the input signal. Therefore, the complementary design technique uses both P and N channel devices in tandem in a typical inverter circuit so that the inverter consumes power only when it switches. When transferring signals from one integrated circuit chip to another, the output drivers of the first chip must provide large impulses to the next chip being driven. It is important that such power is only consumed during switching, so that there is less continuous power dissipation by the output drivers.

A particular fabrication technique that allows for a reduction in process and masking steps is the employment of ion implantation. Ion implantation allows for controlled impurity doses and more shallow and smaller regions to be created in the semiconductor substrate. The extensive use of ion implantation requires a less number of thermal processing steps for impurity doping as well as reduction in the use of wet chemicals and toxic gases. Furthermore, many steps in the fabrication of a semiconductor device by diffusion must be performed in sequence so as to arrive at the desired final structure of the respective devices. However, ion implantation often allows for the order of various steps to be interchanged since the depth of the ion implantation is determined by the energy of the respective ions as they strike the target surface. Ion implantation is particularly adapted for the fabrication of an integrated circuit having a plurality of different device structures.

A prior art example of a method of forming an integrated circuit having a plurality of the different devices in it is the Shappir U.S. Pat. No. 3,921,283. However, the method of Shappir must employ a number of different masks which creates an alignment problem.

In order to place a number of different devices on an integrated circuit chip, it is necessary to be able to control a number of different device thresholds and to be able to make any device an enhancement mode device or depletion mode device. Also, the threshold can be left to be controlled by the bulk resistivity of the substrate. Enhancement mode devices are ones which are normally off if no electrical signal is supplied to their gates while depletion mode devices are normally on if no electrical signal is supplied to their gates. In addition, it is desirable to have devices that are on the brink of the threshold where the voltage in either direction turns them on or off. Still another class of devices are called weak depletion devices, which are only nominally conducting. So it is desirable to have four different types of thresholds for internal devices as well as having complementary devices. Again, prior art methods require an extra number of masking steps to form the respective devices with the consequential alignment problems which reduced the resolution with which the devices could be created and the resulting packing density.

It is then an object of the present invention to provide an improved method for fabricating integrated circuit chips having a plurality of different devices.

It is still another object of the present invention to provide an improved method for fabricating integrated circuit chips which require a minimum number of masking steps.

It is still a further object of the present invention to provide an improved method of fabricating integrated circuit chips which method employs a single mask to define all active areas on the chip.

SUMMARY OF THE INVENTION

In order to achieve the above objects, the present invention is instructed toward a method of fabricating an integrated circuit having a plurality of different devices, which method employs a single mask to define the active areas of all such devices. A silicon oxide-silicon nitride layer is formed on the surface of a silicon wafer so as to define the location of subsequent oxide insulating layers which in turn actually define all the active areas of the circuit. Respective active areas for the different devices can then be formed by selective ion implantation.

A feature then of the present invention resides in the method of fabricating an integrated circuit having a plurality of different devices, which method employs a single mask to define the active areas of all such devices. A silicon oxide-silicon nitride layer defines the location of subsequent oxide insulating layers which in turn actually define all the active areas of the circuit.

DESCRIPTION OF THE DRAWINGS

The above and other objects, advantages and features of the present invention will become more readily apparent from a review of the following specification when taken in conjunction with the drawings wherein.

GENERAL DESCRIPTION OF THE INVENTION

As has been indicated above, the present invention is directed toward a method of forming an integrated circuit having a plurality of different active devices which method employs a single mask to define all active areas of the integrated circuit. In this manner, masking tolerances can be reduced to a minimum thereby increasing the packing density of the particular integrated circuit. The method is directed toward the formation of a plurality of different types of active devices having different threshold values and is particularly directed towards the formation of complementary MOS circuits having both P channel structures and N channel structures. In addition, the method is directed toward the fabrication of an interconnect structure which is compatible with such different type devices.

Figure 1:
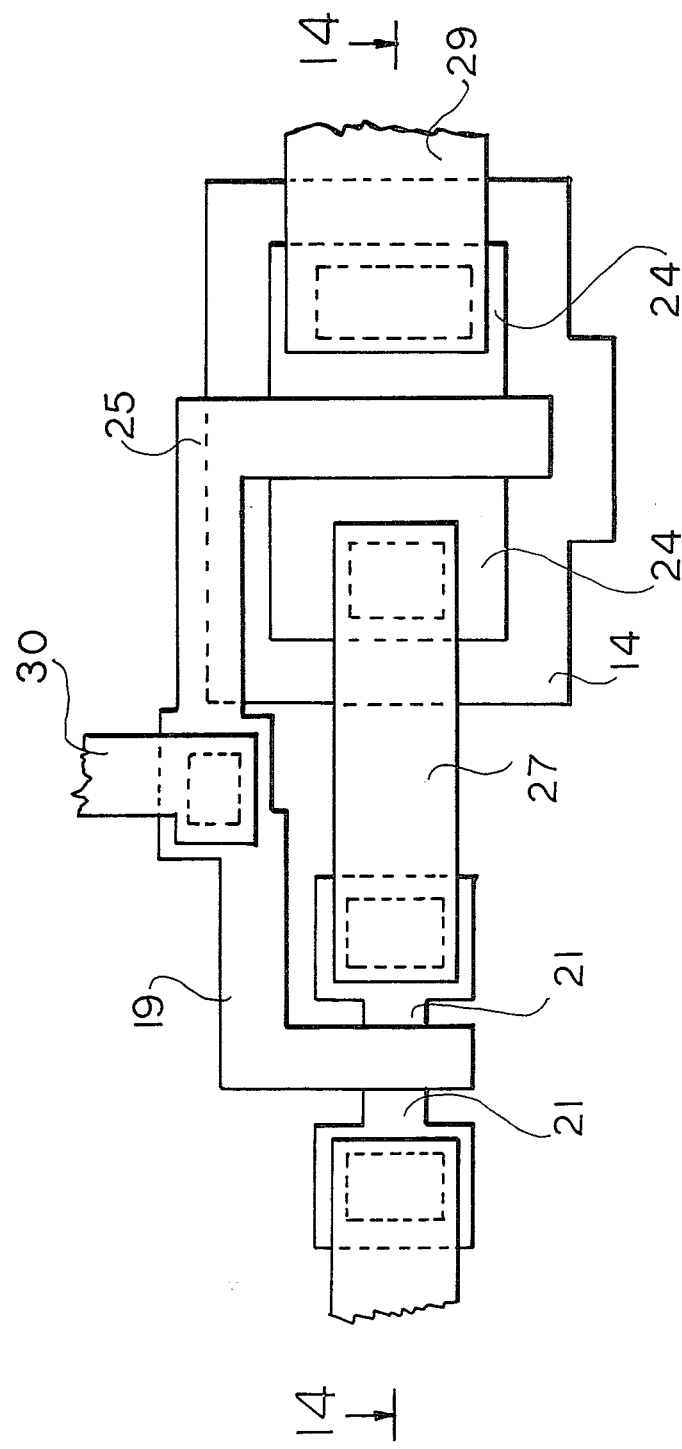
FIG. 1 is a plan view of the present invention.
Figure 2:
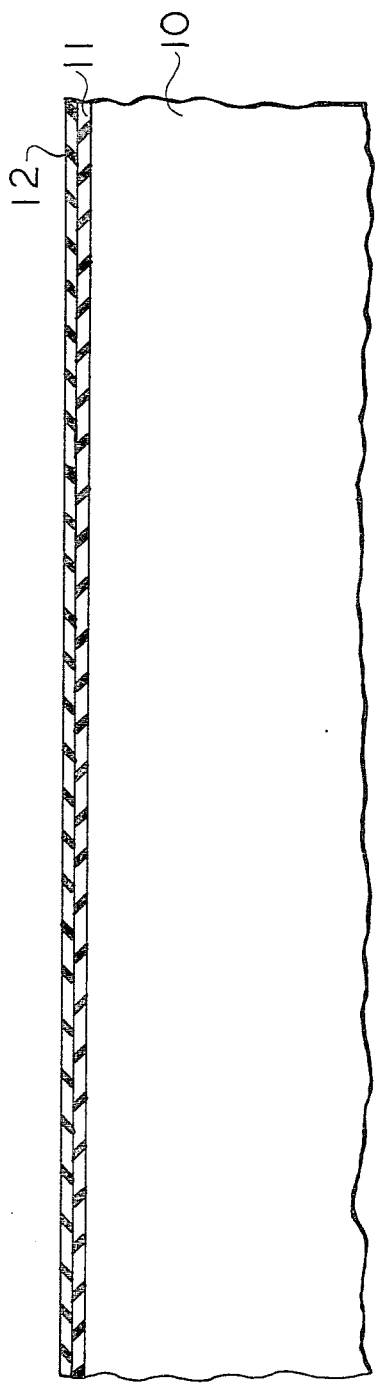
FIGS. 2-14 are cross-sectional views which represent, in sequence, the various steps of the method of the present invention.
Figure 3:
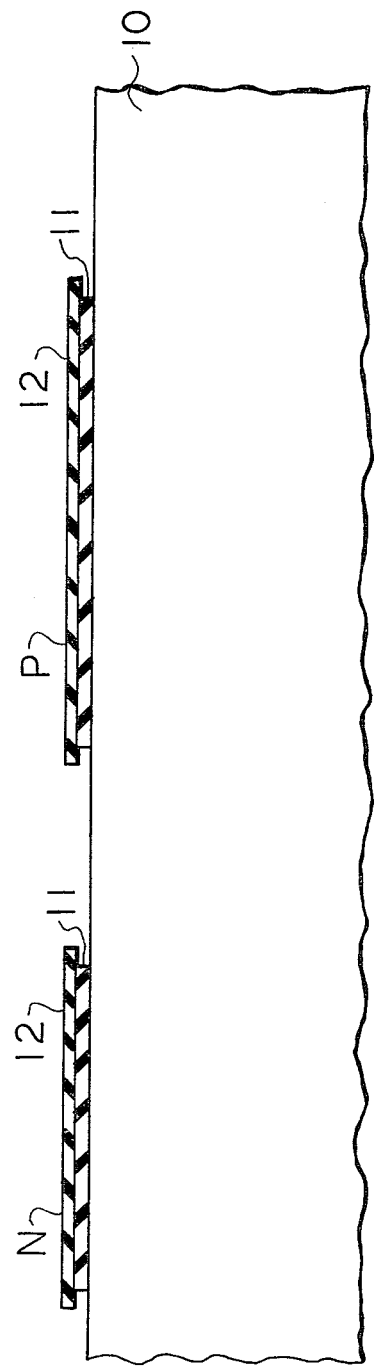

A particular embodiment of the present invention is illustrated in a plan view, as shown in FIG. 1. This view illustrates the structure that results from the method of the present invention and the details thereof will become apparent from the following discussion of that method. Referring now to FIG. 2, the method starts with taking a blank P type wafer 10 and oxidizing the surface thereof to form silicon dioxide layer 11 after which, silicon nitride layer 12 is deposited. Such deposition takes place in a low pressure chemical vapor deposition reactor as is well known in the art. The structure of FIG. 2 as thus formed then is the starting material "sandwich" formed on the respective oxide and nitride layers. The benefit of this sandwich is that silicon nitride does not allow oxygen to diffuse therethrough and, thus, the sandwich later serves as the mask to define all the active devices that are to be fabricated as will be more fully described below. These active areas are then defined by etching away those portions of the oxide nitride sandwich as illustrated in FIG. 3. As the method progresses, the N portion of the remaining sandwich will later define an N channel device while the P portion of the sandwich will define the P channel structure.

Figure 4:
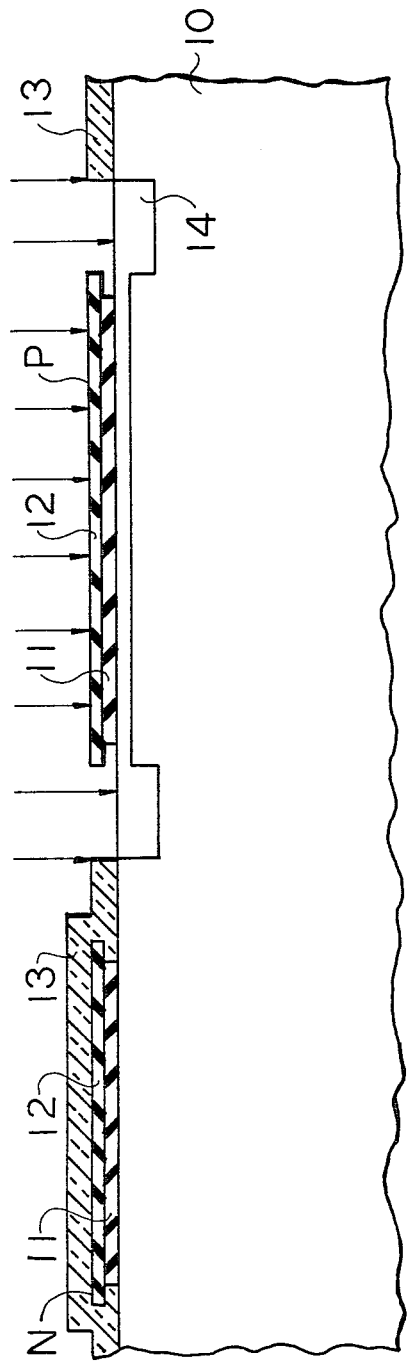
Figure 5:
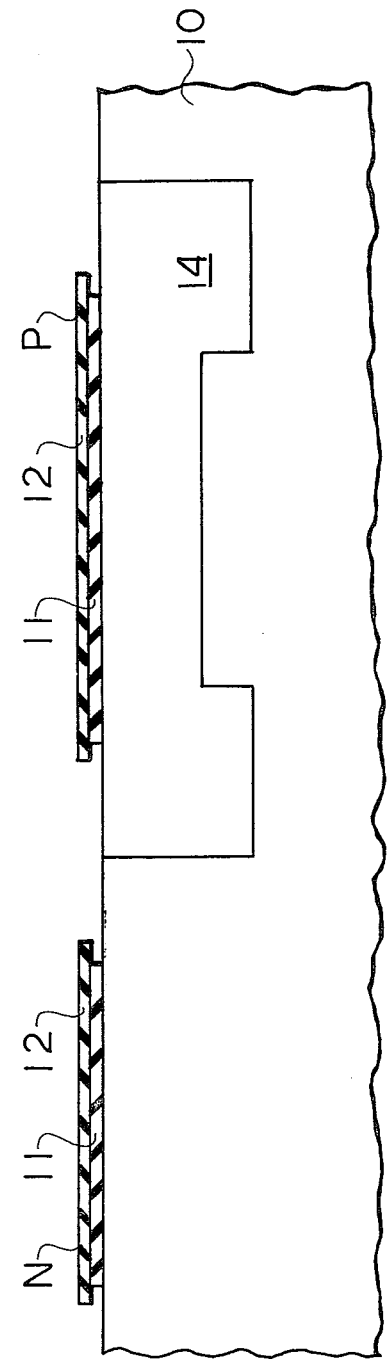

The wafer surface is then covered with photoresist pattern 13 to define only the P channel device as illustrated in FIG. 4. The P channel well 14 is created by the ion implantation of phosphorous which is an N type dopant or impurity. That is to say, the P channel well 14 is formed by an N type implant. Photoresist pattern 13 is then removed and the wafer is subjected to a heat treatment process so as to cause the N type dopants to diffuse to form the profile of P channel well 14 as indicated in FIG. 5.

Figure 6:
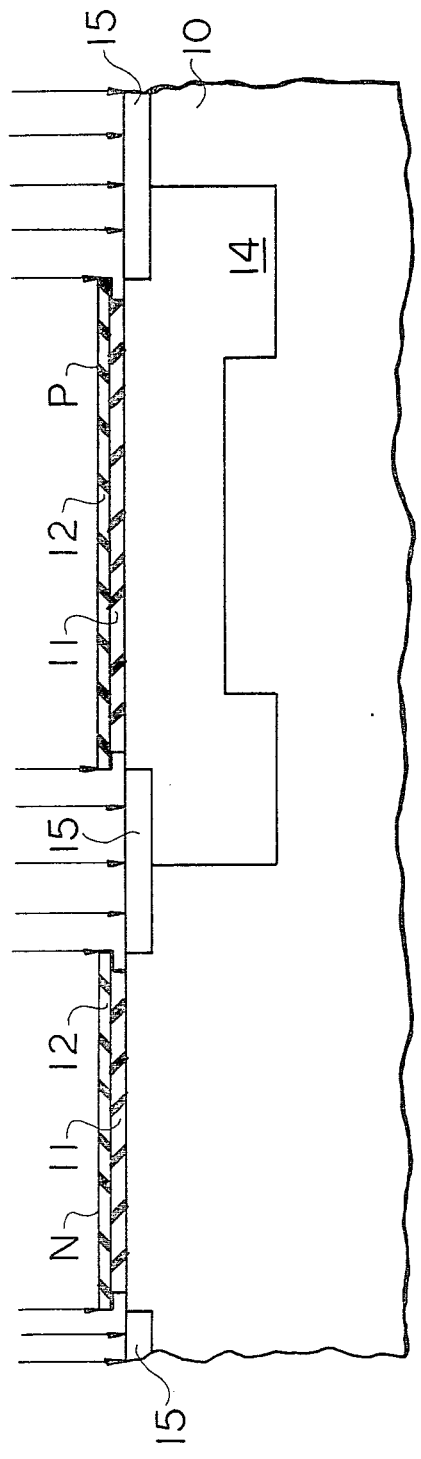
Figure 7:
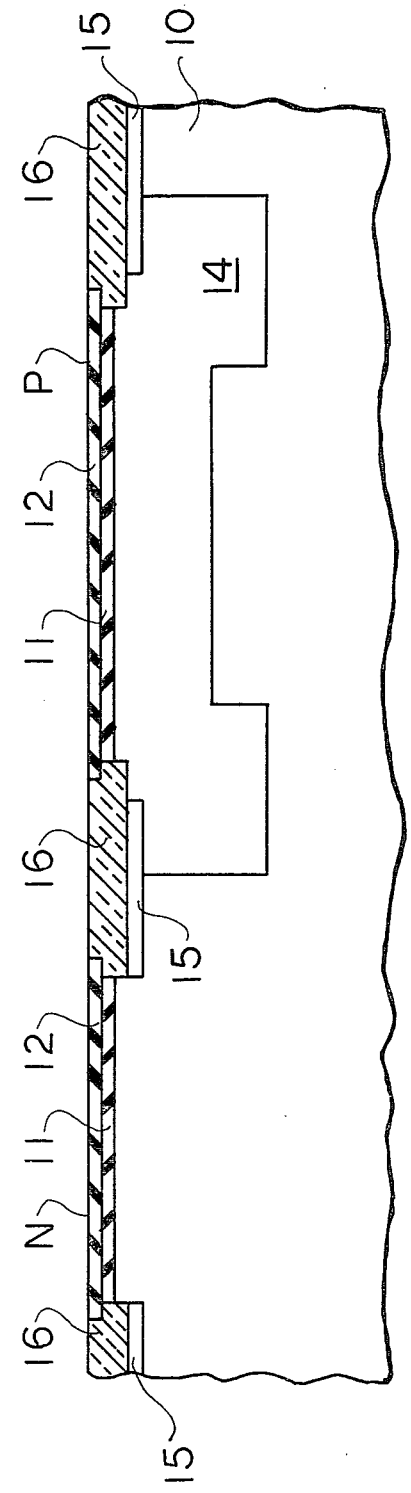

Electrical isolation between the various active structures as indicated by the N and P masks is achieved first by ion implantation of Boron which is a P type dopant as indicated in FIG. 6. The P type regions 15 as shown therein serve to protect against N channel field inversion during the operation of the subsequent circuit. The implant energy is to be sufficiently low that the dopants do not penetrate through the silicon nitride oxide masks that define the respective N and P active areas. The implant is followed by a field oxidation to form oxidation layers 16, as shown in FIG. 7, which are ultimately used for the protection against parasitic inversion during operations of the circuit. Oxide dielectric layers 16 are formed on all portions of the inactive area surfaces and, conversely, define all of the active areas on the surface. The active areas are protected from oxidation by respective silicon nitride layers 12 of the various N and P masks since, as was indicated above, silicon nitride is inert and a barrier to oxygen. The structure as indicated in FIG. 7 indicates that all of the active areas have been formed which are aligned with one another because of the single master mask that has been employed.

Figure 8:
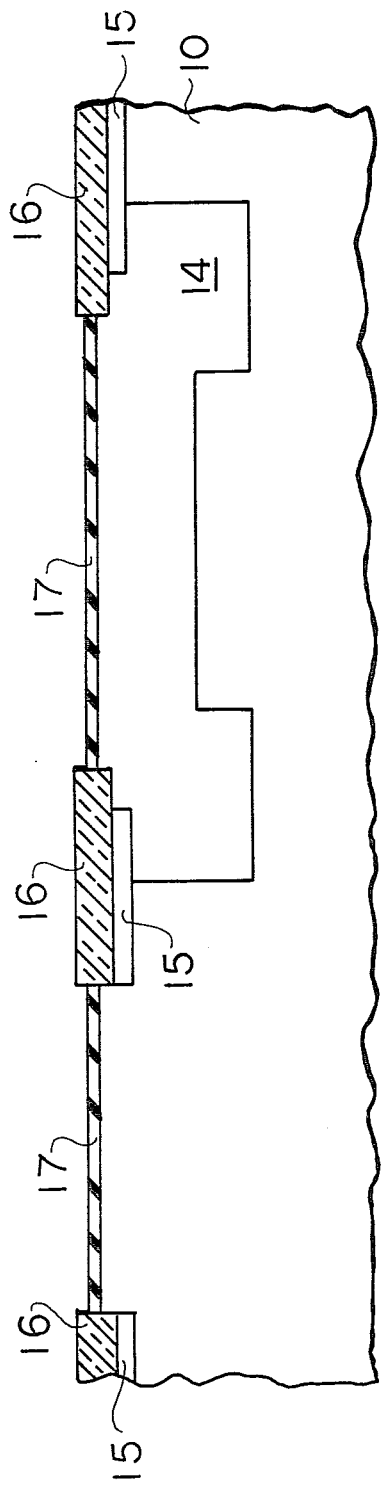

Referring now to FIG. 8, the nitride oxide sandwich masks for both P and N type devices can now be stripped from the wafer surface as the respective active devices have now been defined and isolated by the various field oxidation layers 16 and field implant layers 15. Control gate oxide layers 17 are now grown over the exposed surfaces of the wafer which define the active areas as illustrated in FIG. 8.

The respective ion implantations can now be made in selected areas with different types of dopants so as to control the device thresholds of the respective active devices as has been indicated above. In the present embodiment as described, the respective N channel devices will be formed in the bulk wafer 10, which is Boron doped. As was described in relation to FIG. 4, Phosphorous ions are employed for the device wells which are to be more negative where the P channel devices will be formed. During each of the implantations, photoresist layers will be employed to protect the devices which are not to be implanted during that step.

Figure 9:
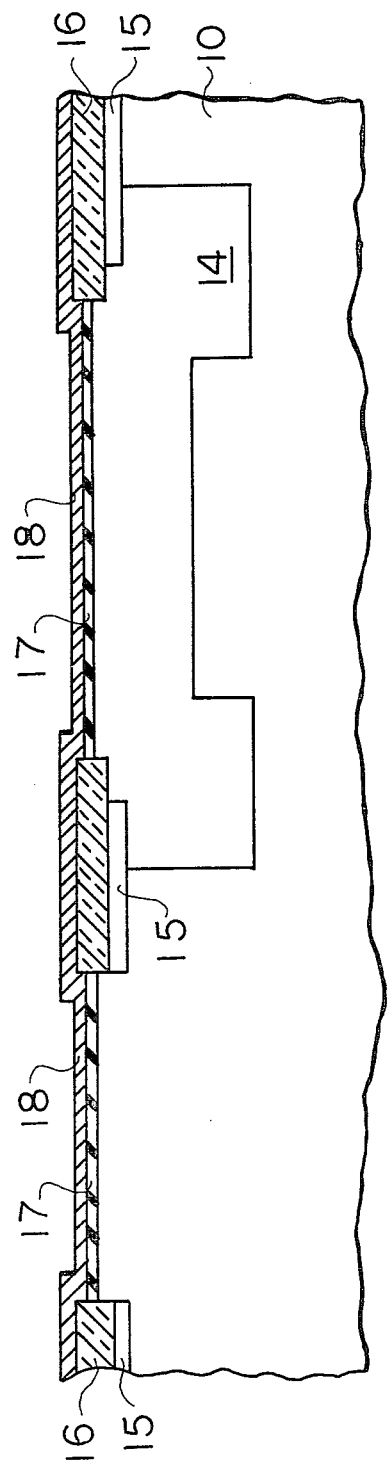
Figure 10:
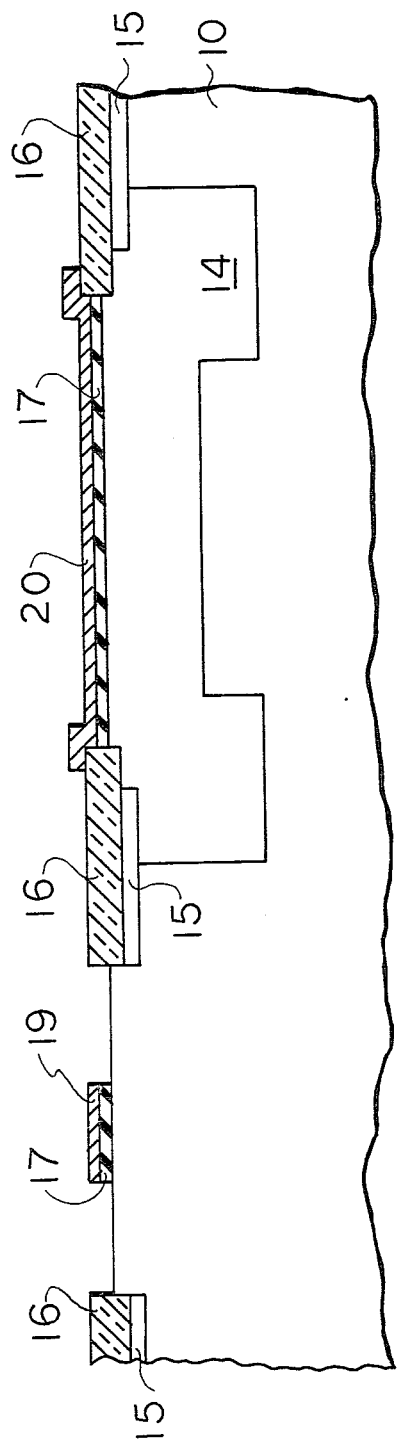
Figure 11:
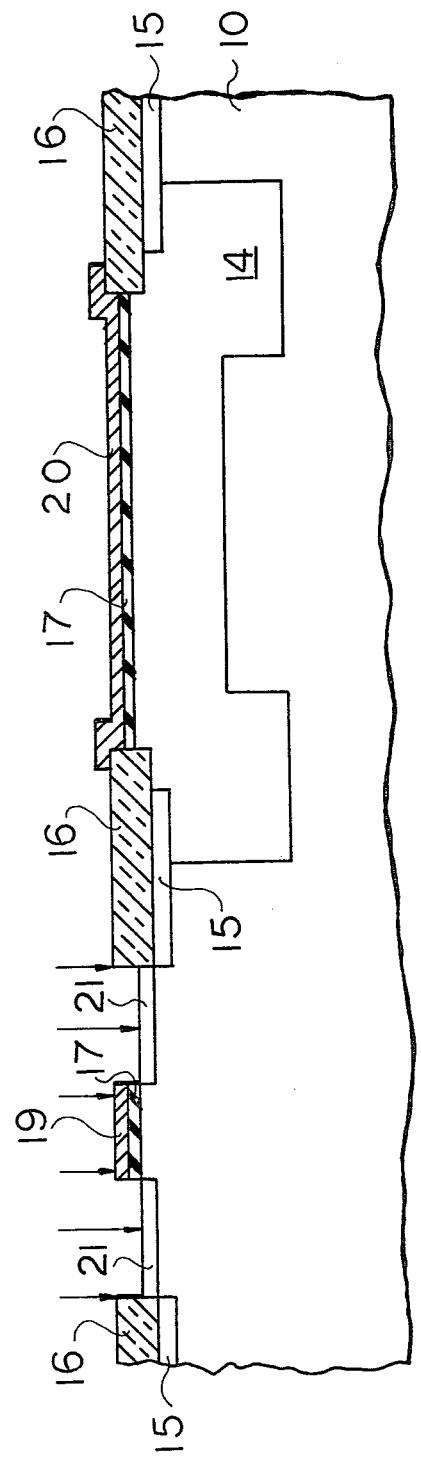

The various control gates now can be formed and also portions of the interconnect structure. These steps are illustrated in FIGS. 9 and 10. As illustrated in FIG. 9, a polysilicon layer 18 which is doped with N+ impurties is deposited over the entire wafer surface. As illustrated in FIG. 10, the respective N channel gates 19 are formed by etching of polysilicon layer 18 (and also oxide layer 17) as are polysilicon interconnect patterns to those gates as shown in FIG. 1. In addition, polysilicon cover 20 is left over the P channel area 14 which, as has been indicated above, is an N type well. As illustrated in FIG. 11, source and drain areas 21 are now formed for the N channel devices by the ion implantation of, in this embodiment, arsenic ions which are of a N+ type.

Figure 12:
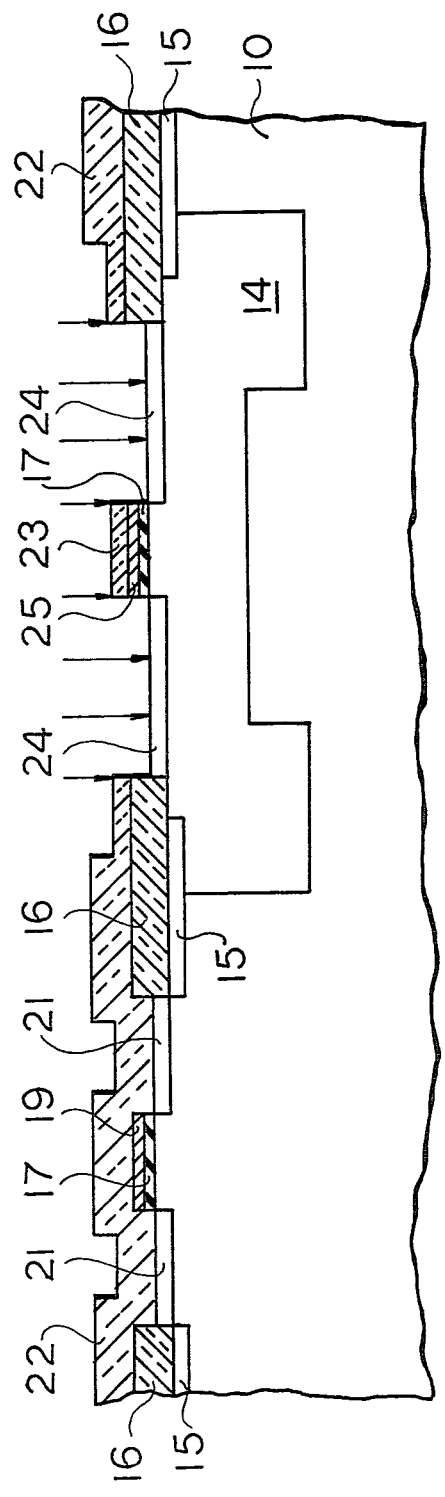

Referring now to FIG. 12, the wafer surface is covered with photoresist pattern 22 except in those areas which define the P channel source and drain regions. This photoresist layer includes portion 23 which defines P channel gate 25 and its corresponding interconnect. P channel gate 25 is formed by etching previous polysilicon layer 20 and underlying gate oxide layer 17 to expose the wafer surface. Source and drain regions 24 are now formed by the ion implantation of Boron ions which are a P+ dopant for the P channel devices.

Figure 13:
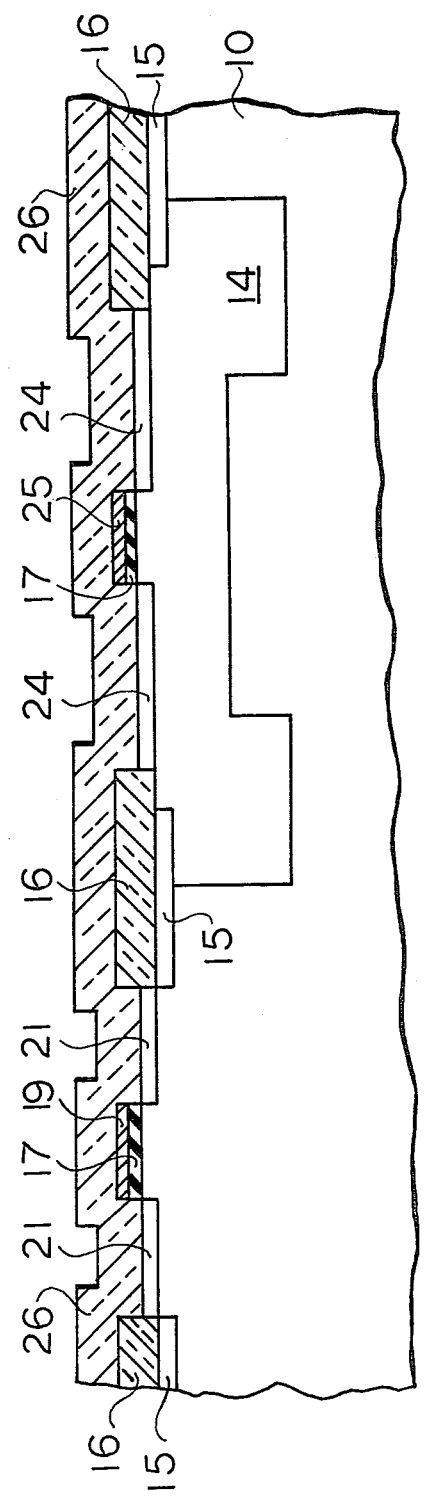

Photoresist layers 22 and 23 are now removed and the respective devices are covered with a thin oxide layer 26 which is formed during a heat treatment or diffusion step which drives the various junctions to the proper depth. Afterwards, a thick oxide layer can be formed over the entire surface of the wafer or chip to serve as an insulating layer. The respective devices are now complete and have a structure as illustrated in FIG. 13.

Figure 14:
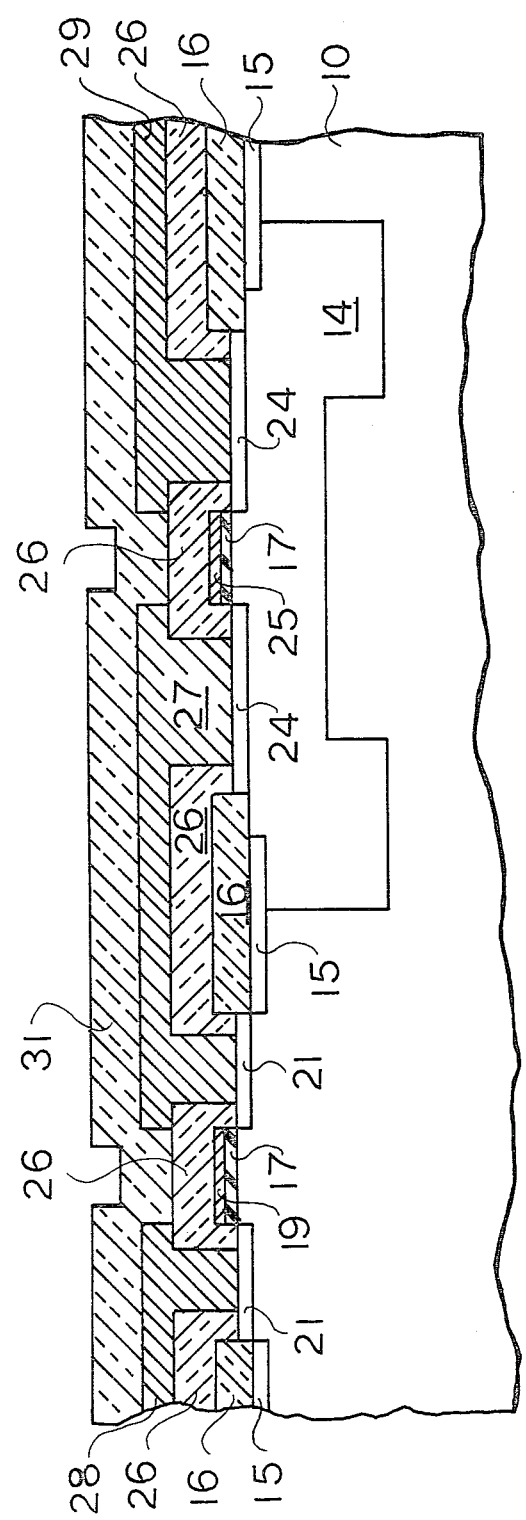

Referring now to FIG. 14, the overall complementary circuit is completed by opening appropriate vias in the oxide layer 26 to receive metal connectors 27, 28 and 29 (and also metal connector as shown in FIG. 1). The entire circuit structure is then covered with a passivation layer 31 so as to complete the structure of FIG. 14.

A particular advantage of the present invention is the employment of the N+ polysilicon interconnect structure between the various gates. Prior art complementary devices employing polysilicon interconnect structures use both N+ and P+ types of polysilicon over the N channel and P channel devices respectively. This construction required shorting straps whenever the two types overlapped in order to prevent the formation of a junction in the interconnect. With the employment of the present invention, this problem is overcome since both the polysilicon interconnect structure and the corresponding field plates for both the N and P type devices are all of an N+ polysilicon. The elimination of the shorting strap allows a circuit layout density increase for the case of complementary structures.

From the above description, it will be evident to one skilled in the art that a plurality of different devices can be formed in an integrated circuit by the use of the single active area mask technique. If it is desired to have a circuit which does not employ certain types of active devices, the portions of the single active area mask, as well as the fabrication steps required therefor, are not employed. Thus, the method of the present invention is adapted for the formation of a spectrum of different type devices and families of circuits employing such devices.

EPILOGUE

A method has been described for fabricating an integrated circuit having a plurality of different devices, which method employs a silicon oxide-silicon nitride layer to define the location of subsequent oxide insulating layers which in turn actually define all the active areas of the circuit. Respective areas are then formed by selective ion implantation. This method provides for the self-alignment of the respective active devices in integrated circuit which in turn allows for the achievement of higher packing density. Because of this self-alignment, the number of masking steps is reduced without requiring tolerance variation.

While the embodiment as described was for the fabrication of complementary MOS integrated circuits, the method can be employed for circuits having a plurality of different devices therein, such as MOS and Bipolar devices and the like. Thus, it will be evident to one skilled in the art that variations and modifications can be made without departing from the spirit and scope of the invention as claimed.

What is claimed is:

1. A method of fabricating an integrated circuit having both P-channel and N-channel transistors including the steps of:
    forming a first layer of material which is impervious to oxygen diffusion therethrough over a major surface of a P-type substrate;
    patterning said first layer to cover only those areas of said surface that are to be occupied by said P-channel and N-channel transistors;
    forming a second layer of photoresist over said substrate surface and patterned first layer;
    opening holes in said second layer whose perimeters lie between said patterned first layer and expose those portions of said patterned first layer which overly areas to be occupied by said P-channel transistors; and
    doping the substrate surface within the holes of said second layer with N-type atoms to form wells for said P-channel transistors.

2. A method according to claim 1 and further including the step of forming an insulating layer on the portion of said substrate surface that is not covered by said patterned first layer.

3. A method according to claim 1 wherein said doping step includes the substeps of:
    implanting said N-type atoms through that portion of said patterned first layer that lies within the holes of said second layer; and
    heating said substrate to diffuse said implanted atoms into said substrate.

4. A method according to claim 1 wherein said first layer of material which is impervious to oxygen diffusion consists of silicon nitride.

5. A method of fabricating an integrated circuit having both P-channel and N-channel transistors including the steps of:
    forming a first layer of material which is impervious to oxygen diffusion therethrough over a major surface of an N-type substrate;
    patterning said first layer to cover only those areas of said surface that are to be occupied by said P-channel and N-channel transistors;
    forming a second layer of photoresist over said substrate surface and patterned first layer;
    opening holes in said second layer whose perimeters lie between said patterned first layer and expose those portions of said patterned first layer which overly areas to be occupied by said N-channel transistors; and
    doping the substrate surface within the holes of said second layer with P-type atoms to form wells for said N-channel transistors.

6. A method according to claim 5 and further including the step of forming an insulating layer on the portion of said substrate surface that is not covered by said patterned first layer.

7. A method according to claim 5 wherein said doping step includes the substeps of:
    implanting said P-type atoms through that portion of said patterned first layer that lies within the holes of said second layer; and
    heating said substrate to diffuse said implanted atoms into said substrate.

8. A method according to claim 5 wherein said first layer of material which is impervious to oxygen diffusion consists of silicon nitride.

9. A method of fabricating an integrated circuit having active devices with majority charge carriers of one conductivity type, and also having active devices with majority charge carriers opposite to said one conductivity type; said method including the steps of:
    forming a first layer of material which is impervious to oxygen diffusion therethrough over a major surface of a substrate with dopant atoms of said one conductivity type;
    patterning said first layer to cover those areas of said surface that are to be occupied by all of said active devices;
    forming a second layer of photoresist over said substrate surface and patterned first layer;
    opening holes in said second layer whose perimeters lie between said patterned first layer and expose those portions of said patterned first layer which overly areas to be occupied by said active devices of said one conductivity type; and
    doping the substrate surface within the holes of said second layer with atoms of said opposite conductivity type to form wells for said active devices of said one conductivity type.

* * * * *